US010851833B2

(12) United States Patent
Kim (10) Patent No.: US 10,851,833 B2
(45) Date of Patent: Dec. 1, 2020

(54) LM GUIDE ASSEMBLING METHOD USING HALF DIVISION AND COMPUTER-READABLE RECORD MEDIUM HAVING PROGRAM RECORDED FOR EXECUTING SAME

(71) Applicant: Gisu Kim, Hwaseong-si (KR)

(72) Inventor: Gisu Kim, Hwaseong-si (KR)

( * ) Notice: Subject to any disclaimer, the term of this patent is extended or adjusted under 35 U.S.C. 154(b) by 10 days.

(21) Appl. No.: 16/319,870

(22) PCT Filed: Jan. 20, 2017

(86) PCT No.: PCT/KR2017/000695
§ 371 (c)(1),
(2) Date: Jan. 23, 2019

(87) PCT Pub. No.: WO2018/131742
PCT Pub. Date: Jul. 19, 2018

(65) Prior Publication Data
US 2019/0219099 A1   Jul. 18, 2019

(30) Foreign Application Priority Data

Jan. 16, 2017 (KR) ........................ 10-2017-0006948

(51) Int. Cl.
*F16C 29/00* (2006.01)
*B23Q 3/18* (2006.01)
(Continued)

(52) U.S. Cl.
CPC ............ *F16C 29/005* (2013.01); *B23Q 3/186* (2013.01); *F16C 29/001* (2013.01);
(Continued)

(58) Field of Classification Search
CPC ........ F16C 29/005; F16C 29/001; G03F 7/70; G03F 7/2051; G03F 7/70758;
(Continued)

(56) References Cited

U.S. PATENT DOCUMENTS

| 5,706,581 A | 1/1998 | Kato et al. |
| 7,997,800 B2 | 8/2011 | Kakei |

(Continued)

FOREIGN PATENT DOCUMENTS

| JP | 08-025162 A | 1/1996 |
| JP | 08-121475 A | 5/1996 |

(Continued)

*Primary Examiner* — John C Hong
(74) *Attorney, Agent, or Firm* — Rabin & Berdo, P.C.

(57) ABSTRACT

Disclosed is an LM guide assembling method using half division, and a computer readable recording medium having a program for executing the same. The method includes: disposing an LM rail on a base; fastening a first hole and a $(2^n+1)$-th hole; installing an angle measuring device; fastening a $(2^{n-1}+1)$-th hole at step S130; respectively disposing the LM blocks on the first hole and the $(2^{n-1}+1)$-th hole; disposing the auxiliary shelf on the LM blocks; setting an angle of the auxiliary shelf to a zero angle; moving the two LM blocks to be on a $(2^{n-1}+1)$-th hole and a $(2^n+1)$-th hole, and measuring an angle of the auxiliary shelf; calculating a straightness correction amount; and moving a position of the $(2^{n-1}+1)$-th hole by the straightness correction amount, and fastening the hole, wherein, the steps are repeated until n becomes 1.

7 Claims, 5 Drawing Sheets

(51) Int. Cl.
*G06F 17/11* (2006.01)
*G03F 7/20* (2006.01)

(52) U.S. Cl.
CPC .............. *G03F 7/2051* (2013.01); *G03F 7/70* (2013.01); *G06F 17/11* (2013.01)

(58) Field of Classification Search
CPC .......... G03F 7/70975; G03F 7/20; G03F 9/00; G03F 9/70; G03F 7/70716; G03F 7/70991; G06F 17/11; B23Q 3/186; H02K 41/03
See application file for complete search history.

(56) References Cited

U.S. PATENT DOCUMENTS

2006/0187439 A1* 8/2006 Korenaga ........... G03F 7/70716
355/72
2014/0346304 A1* 11/2014 Kim ...................... F16C 29/001
248/419

FOREIGN PATENT DOCUMENTS

| JP | 2000-304040 A | 10/2000 |
| JP | 2002-337029 A | 11/2002 |
| KR | 10-0487163 B1 | 5/2005 |
| KR | 10-2011-0131688 A | 12/2011 |
| KR | 10-1377183 B1 | 3/2014 |
| KR | 10-2015-0026181 A | 3/2015 |

* cited by examiner

LM GUIDE ASSEMBLING METHOD USING HALF DIVISION AND COMPUTER-READABLE RECORD MEDIUM HAVING PROGRAM RECORDED FOR EXECUTING SAME

TECHNICAL FIELD

The present invention relates to a method of assembling a linear motion (LM) guide, and a computer readable recording medium having a program for executing the same. More particularly, the present invention relates a method of assembling an LM guide, and a computer readable recording medium having a program for executing the same, wherein the method applies half division when assembling an LM guide in a base so as to improve straightness when assembling the LM guide, and automatically calculates a straightness correction amount from an angle value measured by an angle measuring device so as to reduce measurement time and provide an auto-measurement process.

BACKGROUND ART

Generally, in a method of forming a pattern on a substrate constituting a flat panel display (FPD) such as liquid crystal display device, plasma display device, etc., first pattern material is deposited on a substrate, the pattern material is exposed to light by using a photo mask, and thus a pattern is formed by selectively removing a part of the pattern material or other parts where a chemical characteristic has been changed.

As substrate become large and patterns formed on a surface where light is exposed become fine, a mask-less exposure apparatus without using a photo mask is used. The mask-less exposure apparatus forms a pattern by transferring light beams on the substrate, the method using pattern information that is generated from an electrical signal by using an electronic device.

Such a mask-less exposure apparatus forms a pattern on a surface exposed to a light beam by moving a substrate. Herein, accuracy of a linear stage moving the substrate affects on a quality of the pattern formed on the surface where a light beam is exposed. Particularly, straightness of the linear stage directly affects on the quality of the pattern formed on the surface exposed to a light beam.

A linear stage moves on an LM guide, and in order to improve straightness of the linear stage, the LM guide has to be assembled in a base with high precision of straightness.

Conventionally, when assembling an LM guide, an angle of the LM guide is sequentially measured in a direction to a length of the LM guide by using an angle measuring device, and then an error is corrected. However, when using the above sequentially correction process, an error introduced during the correction process may be accumulated at subsequent measurement points. Accordingly, a large error is accumulated at the end of the LM guide, and thus the LM guide is impossible to be used in assembly requiring high precision of straightness.

Accordingly, development of an LM guide assembling method, whereby an error introduced during an LM guide assembling process is not accumulated at a subsequent measurement point, and errors occurring during the assembling process are reduced, is required.

DISCLOSURE

Technical Problem

Accordingly, the present invention has been made keeping in mind the above problems occurring in the prior art, and an object of the present invention is to provide a method of assembling an LM guide capable of preventing an error introduced when assembling the LM guide from being accumulated at subsequent measurement points.

In addition, another object of the present invention is to provide a method of assembling an LM guide whereby an error introduced when assembling the LM guide is decreased at a subsequent measurement point.

Technical Solution

The present invention provides a method of assembling an LM guide by using half division, wherein the method is for assembling an LM guide in a base by using an LM rail in which a plurality of fastening holes is formed at an equivalent interval in a longitudinal direction, an auxiliary shelf in which a plurality of fastening holes is formed at an interval identical to the interval of the fastening holes in the LM rail, and LM blocks fastened to the auxiliary shelf and in which fastening holes are formed, the method including: disposing, at step S100, the LM rail on the base; fastening, at step S110, among the plurality of fastening holes formed in the LM rail, a first hole and a $(2^n+1)$-th hole from one end of the LM rail by using a fastening means; installing, at step S120, an angle measuring device on the auxiliary shelf; fastening, at step S130, among the plurality of fastening holes formed in the LM rail, a $(2^{n-1}+1)$-th hole from one end of the LM rail by using a fastening means; respectively disposing, at step S140, the LM blocks on the first hole and the $(2^{n-1}+1)$-th hole from one end of the LM rail; disposing, at step S150, the auxiliary shelf on the LM blocks respectively disposed on the first hole and the $(2^{n-1}+1)$-th hole from one end of the LM rail, the auxiliary shelf being formed integrally, and fastening the auxiliary shelf by using a fastening means; setting, at step S160, an angle of the auxiliary shelf to a zero angle by using the angle measuring device; moving, at step S170, the two LM blocks on which the auxiliary shelf is coupled to be disposed on a $(2^{n-1}+1)$-th hole and a $(2^n+1)$-th hole from one end of the LM rail, respectively, and measuring an angle of the auxiliary shelf; calculating, at step S180, a predetermined straightness correction amount according to the angel of the auxiliary shelf obtained in the step S170; and loosening, at step S190, a fastening means of the $(2^{n-1}+1)$-th hole from one end of the LM rail and moving a position of the $(2^{n-1}+1)$-th hole of the LM rail by the straightness correction amount obtained in the step S180, and fastening the hole by using the fastening means, wherein, the steps S130 to S190 are repeated while reducing n by one until n becomes n=1, wherein n is a natural number.

In addition, in the present invention, the straightness correction amount obtained in the step S180 may be calculated by $h=P \sin(b/2)$, wherein, h is straightness correction amount, P is a distance between adjacent fastening holes in an LM rail, and b in an angle of auxiliary shelf obtained in step S170.

In addition, the angle measuring device of the present invention may be a laser interferometer or an autocollimator.

In addition, the present invention provides a computer readable recording medium storing a program of performing the LM guide assembling method.

In addition, the present invention provides a computer readable recording medium storing a program of performing step S180.

In addition, the present invention provides a laser interferometer performing step S180.

In addition, the present invention provides an autocollimator performing step S180.

Advantageous Effects

According to a method of assembling an LM guide by using half division according to the present invention, accumulation of an error introduced when assembling the LM guide can be prevented.

In addition, according to a method of assembling an LM guide by using half division according to the present invention, an error introduced when assembling the LM guide can be decreased at subsequent measurement points.

In addition, according to a method of assembling an LM guide by using half division according to the present invention, a straightness correction amount can be provided from an angle measured by an angle measuring device.

In addition to the above-mentioned effects, specific effects of the present invention will be described together with explaining specific matters for carrying out the following invention.

MODE FOR INVENTION

Hereinafter, the present disclosure will be described with reference to the accompanying drawings. Although specific embodiments are illustrated in the drawings and related detailed descriptions are disclosed, the present disclosure may have various modifications and several embodiments. However, various embodiments of the present disclosure are not limited to a specific implementation form and it should be understood that the present disclosure includes all changes and/or equivalents and substitutes included in the spirit and scope of the present disclosure. In connection with descriptions of the drawings, similar components may be designated by the same reference numeral.

In addition, the expressions "1st", "2nd", "first", or "second" as used in of the present disclosure may modify various components of the embodiments, but do not limit the corresponding components. For example, the above expressions do not limit the sequence and/or importance of the components. The expressions may be used for distinguishing one component from other components. For example, a first user device and a second user device indicate different user devices although both of them are user devices. For example, without departing from the scope of the present disclosure, a first structural element may be referred to as a second structural element. Similarly, the second structural element also may be referred to as the first structural element.

The terms used in the present disclosure are used to describe a specific embodiment, and do not limit the scope of other embodiments. A singular form may include a plural form. All the terms including a technical or scientific term may have the same meaning as terms generally understood by those skilled in the relevant art. The terms defined in a general dictionary may be interpreted as having the same or similar meaning in a context of related technology, and are not to be interpreted abnormally or excessively unless clearly defined in the present disclosure. According to situations, the terms defined in the present disclosure cannot be interpreted as excluding the embodiments of the present disclosure.

Figure 1:
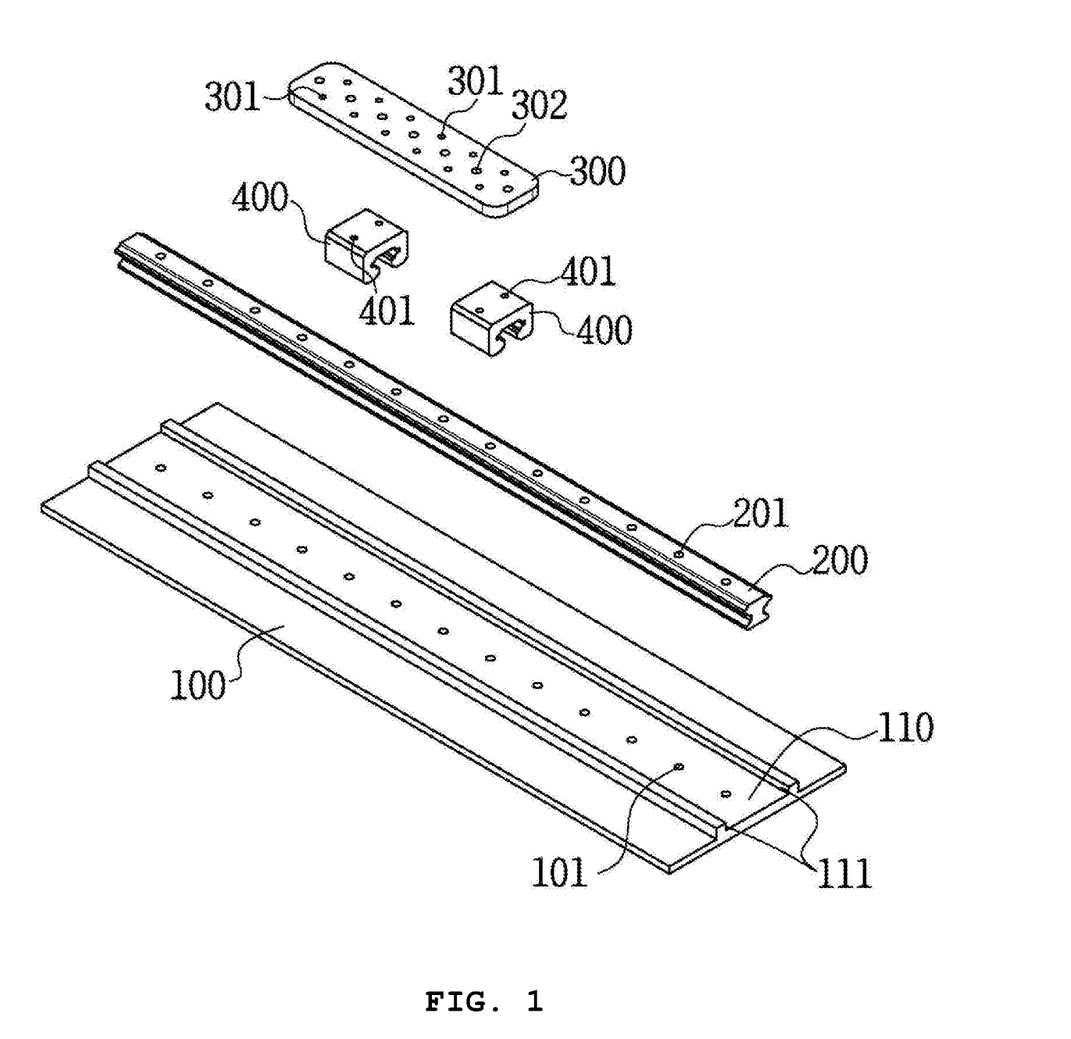
FIG. 1 is a view showing a deployed LM guide according to the present invention.
Figure 2:
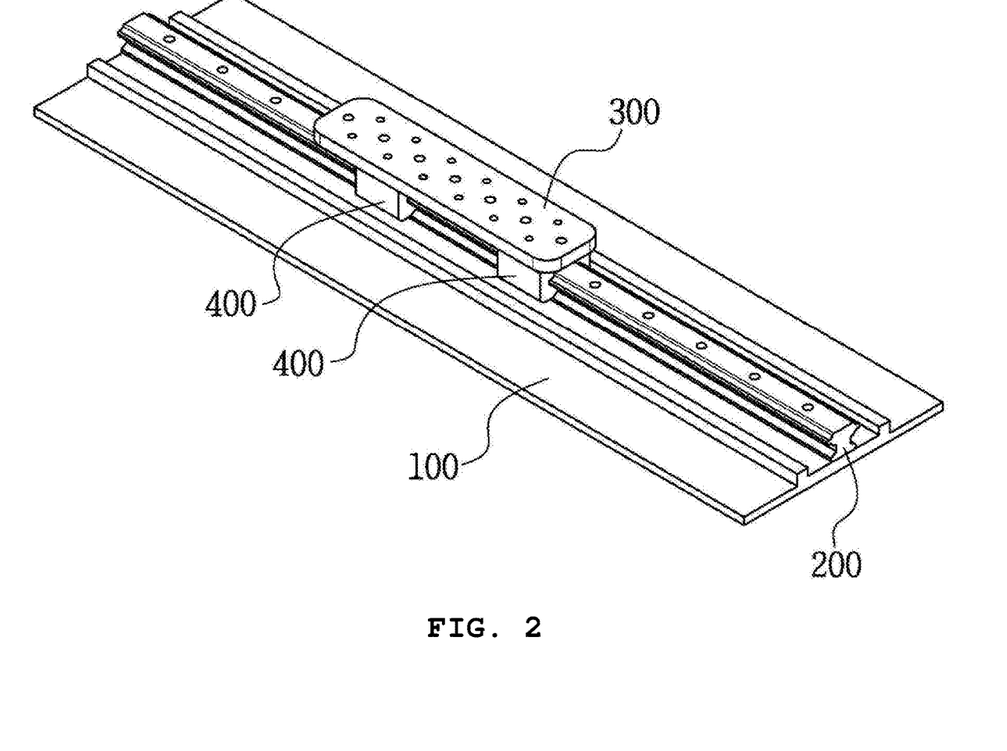
FIG. 2 is a view showing a perspective view of an assembled LM guide according to the present invention.

FIG. 1 is a view showing a deployed LM guide according to the present invention, and FIG. 2 is a view showing a perspective view of an assembled LM guide according to the present invention.

Description will be made by referencing FIGS. 1 and 2.

An LM guide includes an LM rail 200 and LM blocks 400.

The LM rail 200 is a rail on which the LM blocks 400 move. The LM rail 200 is assembled on a base 100. When the LM rail 200 is not assembled in high precision of straightness, a device moving by being coupled with the LM rail 200 is impossible to perform precise operation. Accordingly, assembling the LM rail 200 on the base 100 in high precision of straightness is major factor for accuracy of the assembling process.

In the LM rail 200, fastening holes 201 are formed in a longitudinal direction at an equivalent interval. The fastening hole 201 is a hole to which a fastening means is inserted when the LM rail 200 is assembled in the base 100. As the fastening means, typically, a bolt is used. However, it is not limited thereto, and various fastening means may be used.

In the base 100, the LM rail 200 is assembled therein. In the base 100, a LM rail installation part 110 is formed so that the LM rail 200 is assembled therein. The LM rail installation part 110 is formed with flank surfaces 111 which are parallel according to a longitudinal direction of the LM rail 200, and the LM rail 200 is assembled between the both flank surfaces.

In the base 100, fastening holes 101 for fastening the LM rail 200 are formed in the LM rail installation part 110 in a longitudinal direction at an equivalent interval. A distance between the fastening holes 101 formed in the LM rail installation part 110 is equal to a distance between the fastening holes 201 in the LM rail 200.

The LM block 400 moves by being coupled with the LM rail 200, and is formed with fastening holes 401 so as to be assembled with an auxiliary shelf 300 that will be described later. Two or four fastening holes 401 are typically formed. The fastening holes 401 are formed in an even number to balance the fastening.

An appearance of the LM block 400 is formed in a shape of "  " to cover the LM rail 200.

An auxiliary shelf 300 is provided for performing a method of assembling an LM guide by using half division according to the present invention.

The auxiliary shelf 300 is coupled with the LM blocks 400. For this, fastening holes 301 are formed in the auxiliary shelf 300 in a longitudinal direction. As shown in FIG. 1, two fastening holes 401 are formed in one LM block 400, and in order to be coupled with the LM block 400, in the auxiliary shelf 300, fastening holes 301 in association with the fastening holes 401 of the LM block 400 are formed at both sides in a longitudinal direction.

Herein, a distance between the fastening holes 301 is equal to a distance between the fastening holes 201 of the LM rail 200. This is because, when assembling the LM rail 200 in the base 100, the LM block 400 has to be disposed on the fastening holes 201 formed in the LM rail 200.

In the auxiliary shelf 300, through holes 302 are formed between the fastening holes 301 formed at both sides in a longitudinal direction. The through holes 302 are holes into which a driver for loosening bolts fastened in the LM rail 200 is inserted.

Figure 3:
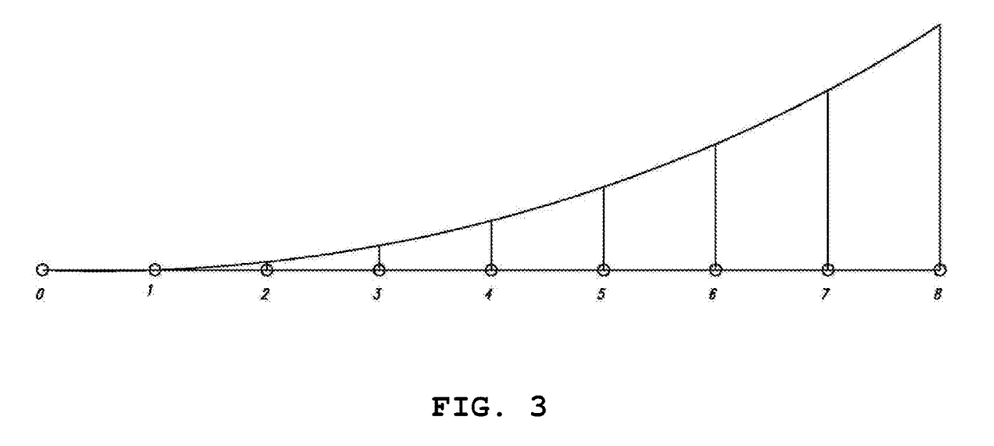
FIG. 3 is a view showing influence of an introduced error on subsequent points when using a method of assembling an LM guide by using sequential correction.

FIG. 3 is a view showing influence of an introduced error on subsequent points when using a method of assembling an LM guide by using a sequential correction process.

Referring to FIG. 3, a method of assembling an LM guide by using a conventional sequential correction process will be described.

A straight line shown in FIG. 3 shows when the LM rail 200 is assembled in optimal straightness, and numbers 0 to 8 represented on the straight line represent bolts fastened on a rail.

A curve shown in FIG. 3 represents errors introduced during correction.

In a conventional sequential correction method, an angle at each bolt is sequentially measured by an angle measuring device, the bolt is loosened and an error thereof is corrected, and then the bolt is refastened.

In a section 0-1, the angle measuring device is set to a zero angle based on an angle of the rail. Then, the angle measuring device moves to a section 1-2 of the rail, and measures an angle, and then error correction is performed. Herein, an error may be introduced since the correction is performed by a person, the introduced error may exert influence on bolts 3 to 8, and an accumulated introduced error at each bolt becomes large as the correction is performed from the bolt 3 to the bolt 8.

In addition, an error introduced at a section 2-3 exerts influence on the bolts 4 to 8. According to the above method, a large accumulated error occurs at the bolt 8 by the influence of the previous bolts 2 to 7.

Figure 4:
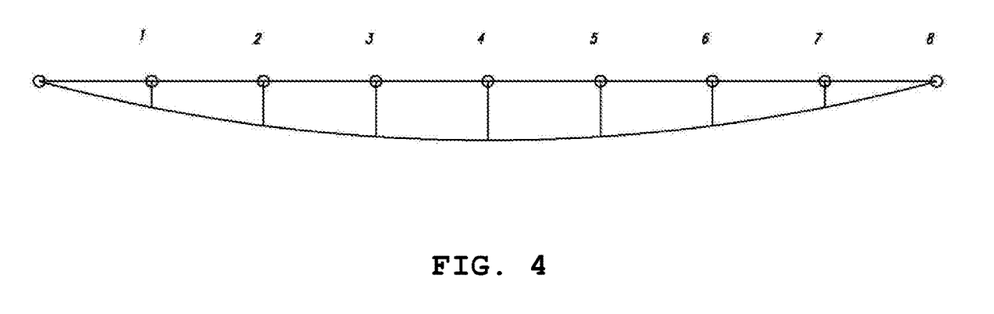
FIG. 4 is a view showing influence of an introduced error on subsequent points when using a method of assembling an LM guide by using half division.

FIG. 4 is a view showing influence of an introduced error on subsequent points when assembling an LM guide by using half division.

A method of assembling an LM guide by using half division will be described with reference to FIG. 4.

A straight line shown in FIG. 4 shows when the LM rail 200 is assembled in optical straightness, and numbers 0 to 8 represented on the straight line represent fastening bolts on a rail.

A curve shown in FIG. 4 shows errors introduced during a correction process.

In a correction process using half division, first, both end bolts of an LM rail 200 to be corrected, in other words, bolts 0 and 8, are fixed, and a straight line between bolts 0 and 8 is set to a zero angle by using an angle measuring device.

Then, at bolt 4 positioned at the middle between a section 0-8, angle measurement and error correction are performed. Herein, an error may be introduced since the correction is performed by a person. However, when an error is introduced at bolt 4, an error that may be introduced at bolts 1, 2, 3, 5, 6, and 7 by the error introduced at bolt 4 is remarkably reduced compared to the error introduced at bolt 4.

Then, in bolt 2 positioned at the middle between a section 0-4, angle measurement and error correction are performed. When error correction is performed by the above method, an error introduced during the correction process gradually decreases, and thus straightness of an LM guide assembly may be improved.

Figure 5:
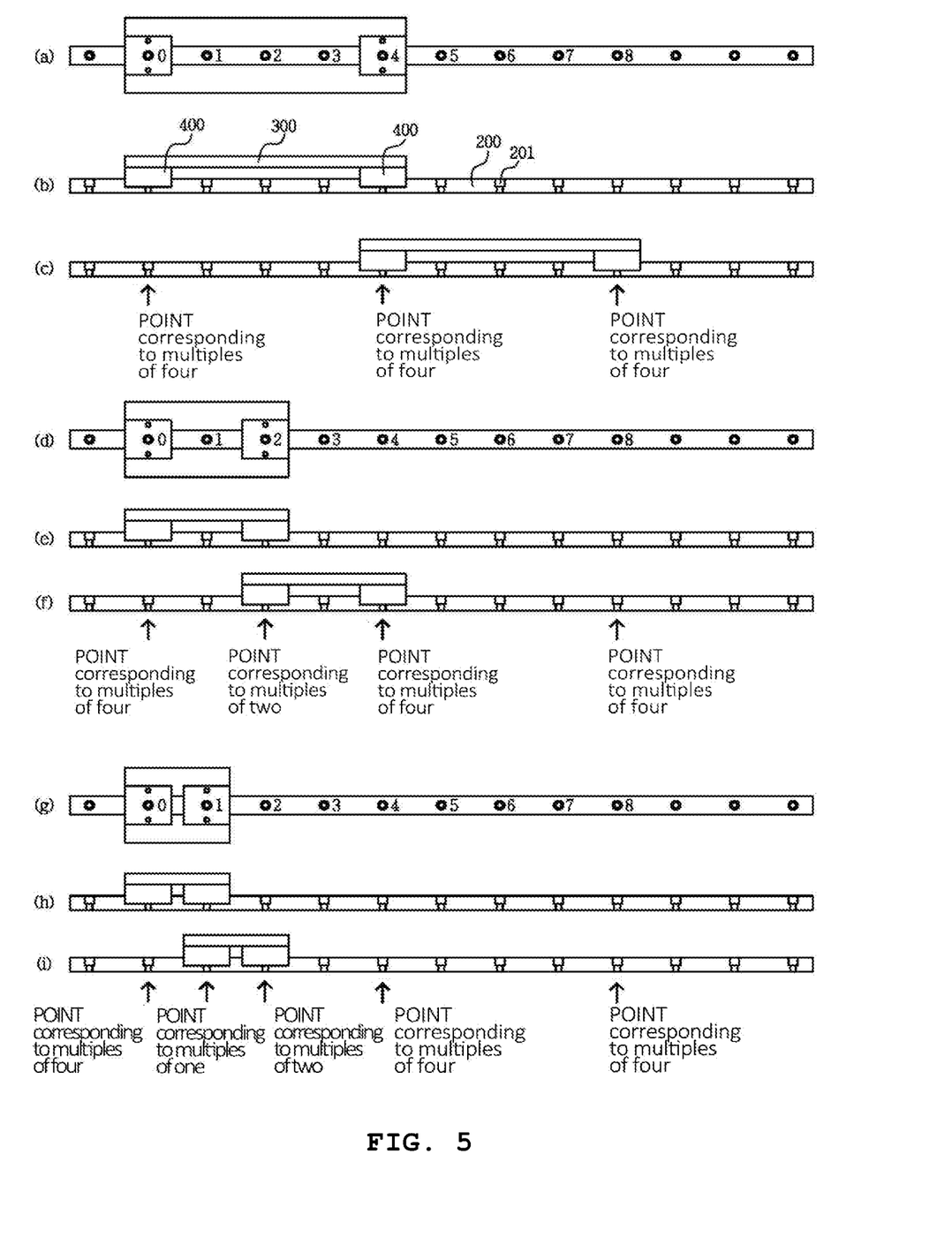
FIG. 5 is a view step-wisely showing assembling an LM guide according to the present invention.
Figure 6:
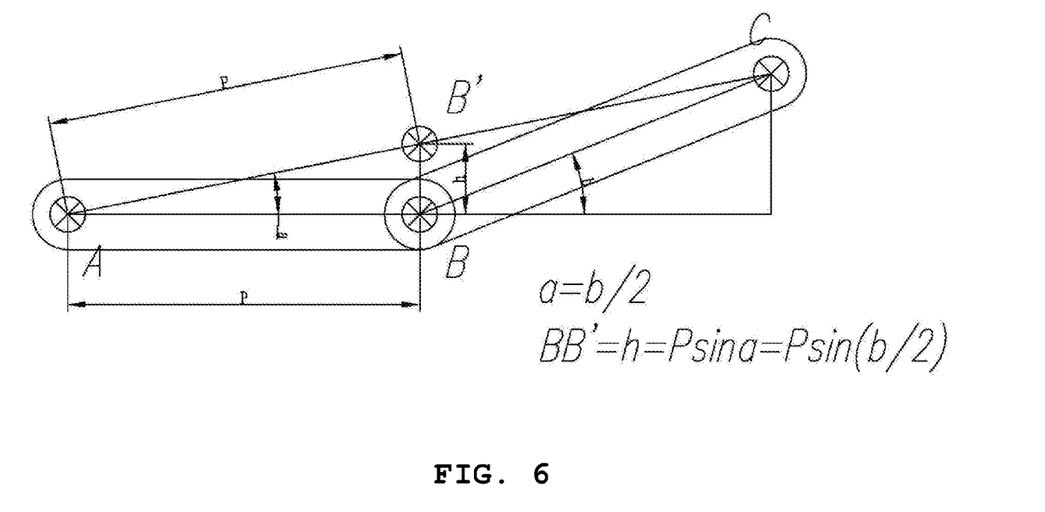
FIG. 6 is a view showing calculating a straightness correction amount of an LM guide according to the present invention.

FIG. 5 is a view step-wisely showing assembling an LM guide according to the present invention, FIGS. 5(*a*), to 5(*d*), and 5(*g*) are planar views, and FIGS. 5(*b*), 5(*c*), 5(*e*), 5(*f*), 5(*h*), and 5(*i*) are lateral views. In addition, FIG. 6 is a view showing calculating a straightness correction amount of an LM guide according to the present invention.

A process of assembling an LM guide by using half division will be described in detail with reference to FIGS. 5 and 6.

When describing half division, a general case using a number ($2^n$+1) of bolts will be described. FIG. 5 shows an example of n=3, that is, shows a case of correcting for a section between 0 and 8 in a LM rail 200 shown in FIG. 5.

First, step S100 of disposing an LM rail 200 on a base 100 is performed.

Step S110 of fastening, among a plurality of fastening holes 201 formed in the LM rail 200, the first hole and the ($2^n$+1)-th hole from one end of the LM rail 200 by using fastening means is performed. In other words, hole 0 and hole 8 are fastened by using the fastening means.

Step S120 of installing an angle measuring device on an auxiliary shelf 300 used for applying half division is performed.

Herein, the angle measuring device used when assembling the LM guide will be introduced.

Typically, as the angle measuring device, a laser interferometer, an autocollimator, etc. may be used.

A laser interferometer is configured with an interferometer body and a reflector, and an autocollimator is also configured with an autocollimator body and a reflector.

In order to assemble an LM guide, a laser interferometer body or an autocollimator body is disposed in a longitudinal direction of the LM rail 200 by being spaced apart from the LM rail 200, and a reflector is installed on an auxiliary shelf 300.

When light focused and irradiated on the reflector is reflected by the reflector, in the body of the angle measuring device, an angle is calculated by detecting the reflected light.

Since the above feature is well known in the technical field, a detailed explanation thereof will be omitted. In addition, a laser measuring device is not shown in the figure.

Then, step S130 of fastening, among the plurality of fastening holes 201 formed in the LM rail 200, the ($2^{n-1}$+1)-th hole from one end of the LM rail 200 by using fastening means is performed. In other words, in FIG. 5, hole 4 is fastened by using a bolt.

Then, step S140 of respectively disposing LM blocks 400 on the first hole and the ($2^{n-1}$+1)-th hole from one end of the LM rail 200 is performed.

As shown in FIG. 5(*a*), the LM blocks 400 are disposed on hole 0 and hole 4.

Then, step S150 of disposing the auxiliary shelf 300 that is formed integrally on the LM blocks 400 that are disposed on the first hole and the ($2^{n-1}$+1) hole from one end of the LM rail 200 is performed.

In other words, as shown in FIG. 5(*a*), on the LM blocks 400 respectively disposed on hole 0 and hole 4, the auxiliary shelf 300 that is formed integrally is disposed and fastened by using the fastening means.

Then, step S160 of setting an angle of the auxiliary shelf 300 to a zero angle in the angle measuring device is performed.

Then, step S170 of moving the two LM blocks 400 on which the auxiliary shelf 300 is coupled to be respectively disposed on the $(2^{n-1}+1)$-th hole and the $(2^n+1)$-th hole from one end of the LM rail 200, and measuring an angle of the auxiliary shelf 300 is performed.

In other words, as shown in FIG. 5(c), the two LM block 400 on which the auxiliary shelf 300 is coupled move to be respectively disposed on hole 4 and hole 8, and the angle of the auxiliary shelf 300 is measured.

Then, step S180 of calculating a predetermined straightness correction amount according to the angle of the auxiliary shelf 300 obtained in step S170 is performed.

A process of calculating a straightness correction amount will be described with reference to FIG. 6.

When an angle b of a section B-C and a distance P between adjacent bolts in a LM rail 200 configured with a section A-B and a section B-C in FIG. 6 are provided, a straightness correction amount h at a point B is obtained by the equation below.

$$BB'=h=P\sin(a)=P\sin(b/2)$$

Accordingly, in the above equation, when P and angle b are provided, the straightness correction amount h may be simply calculated.

Then, step S190 of loosening the fastening means of the $(2^{n-1}+1)$-th hole from one end of the LM rail 200, moving a position of the $(2^{n-1}+1)$-th hole of the rail by the straightness correction amount obtained in step S180, and re-fastening the hole by using the fastening means is performed.

Herein, a direction of moving the position of the $(2^{n-1}+1)$-th hole of the rail by the straightness correction amount is perpendicular to a longitudinal direction of the LM rail, and moves in a direction corresponding to a left direction or to a right direction of the angle of the auxiliary shelf 300 obtained in step S170 based on a longitudinal direction of the LM rail.

In other words, bolt 4 is loosened and, a hole position of bolt 4 is moved by the straightness correction amount, and then bolt 4 is re-fastened again by using the fastening means.

Steps S130 to S190 described above is repeated until n becomes n=1 by decreasing n by one. Herein, n is n is a natural number.

FIGS. 5(d) to 5(i) are views showing the above repeating process.

According to the above process, by using a method of assembling an LM guide by using half division according to the present invention, an error introduced during a correction process is not accumulated, but rather reduced. Accordingly, implementing straightness higher than a case using an LM guide assembling method using a conventional sequential correction process may be available.

In addition, a program performing a method of assembling an LM guide by using half division according to the present invention may be stored in a computer readable recording medium such as hard disk, etc.

Further, a program performing a method of assembling an LM guide by using half division according to the present invention may be installed in a laser interferometer or autocollimator, and executed therein.

By using a laser interferometer or autocollimator with a program performing a method of assembling an LM guide by using half division when assembling an LM guide stored therein, a user may simply calculate a straightness correction amount h by inputting a distance between bolting holes and a measured angle to the laser interferometer or autocollimator while executing the program performing the method of assembling an LM guide by using half division, and conveniently reflect the same when performing correction.

The above straightness correction amount may be calculated in a controller of the laser interferometer or autocollimator.

Although the preferred embodiments of the present invention have been illustrated and described, those skilled in the art will appreciate that the present invention should not be limited to the above specific embodiments and various modifications thereof are possible without departing from the scope and spirit of the invention as disclosed in the accompanying claims and these modifications should not be understood independently of the technical idea of the present invention.

What is claimed is:

1. A method of assembling a linear motion (LM) guide by using half division, wherein the method is for assembling an LM guide in a base by using an LM rail in which a plurality of fastening holes is formed at an equivalent interval in a longitudinal direction, an auxiliary shelf in which a plurality of fastening holes is formed at an interval identical to the interval of the fastening holes in the LM rail, and LM blocks fastened to the auxiliary shelf and in which fastening holes are formed, the method comprising:

disposing, at step S100, the LM rail on the base;
 fastening, at step S110, among the plurality of fastening holes formed in the LM rail, a first hole and a $(2.\text{sup}.n+1)$-th hole from one end of the LM rail by using a fastening means;
 installing, at step S120, an angle measuring device on the auxiliary shelf;
 fastening, at step S130, among the plurality of fastening holes formed in the LM rail, a $(2.\text{sup}.n-1+1)$-th hole from one end of the LM rail by using a fastening means;
 respectively disposing, at step S140, the LM blocks on the first hole and the $(2.\text{sup. }n-1+1)$-th hole from one end of the LM rail;
 disposing, at step S150, the auxiliary shelf on the LM blocks respectively disposed on the first hole and the $(2^{n-1}+1)$-th hole from one end of the LM rail, the auxiliary shelf being formed integrally, and fastening the auxiliary shelf by using a fastening means;
 setting, at step S160, an angle of the auxiliary shelf to a zero angle in the angle measuring device;
 moving, at step S170, the two LM blocks on which the auxiliary shelf is coupled to be disposed on a $(2^{n-1}+1)$-th hole and a $(2^n+1)$-th hole from one end of the LM rail, respectively, and measuring an angle of the auxiliary shelf;
 calculating, at step S180, a predetermined straightness correction amount according to the angel of the auxiliary shelf obtained in the step S170; and
 loosening, at step 5190, a fastening means of the $(2.\text{sup}.n-1+1)$-th hole from one end of the LM rail and moving a position of the $(2^{n-1}+1)$-th hole of the LM rail by the straightness correction amount obtained in the step S180, and fastening the hole by using the fastening means, wherein, the steps S130 to S190 are repeated while reducing n by one until n becomes n=1, wherein n is a natural number.

2. The method of claim 1, wherein the straightness correction amount obtained in the step S180 is calculated by using an equation below, $$h=P\sin(b/2)$$

wherein, h: straightness correction amount
P: distance between adjacent fastening holes in an LM rail
b: angle of auxiliary shelf obtained in step S170.

3. The method of claim 2, wherein the angle measuring device is a laser interferometer or an autocollimator.

4. A computer readable recording medium storing a program of performing an LM guide assembling method of claim 1.

5. A computer readable recording medium storing a program of performing step S180 of claim 1.

6. A laser interferometer performing step S180 of claim 1.

7. An autocollimator performing step S180 of claim 1.

* * * * *